United States Patent [19]

Millar

[11] Patent Number: 4,823,296
[45] Date of Patent: Apr. 18, 1989

[54] FIRST ORDER DIGITAL FILTER WITH CONTROLLED BOOST/TRUNCATE QUANTIZER

[75] Inventor: Paul C. Millar, Felixstowe, England

[73] Assignee: British Telecommunications public limited company, England

[21] Appl. No.: 856,474

[22] Filed: Apr. 28, 1986

[30] Foreign Application Priority Data

Apr. 30, 1985 [GB] United Kingdom ............... 8510969

[51] Int. Cl.$^4$ .............................................. G06F 15/31
[52] U.S. Cl. ................................................ 364/724.03
[58] Field of Search ............ 364/745, 724, 733, 724.03

[56] References Cited

U.S. PATENT DOCUMENTS

4,034,196  7/1977  Butterweck et al. ............... 364/745
4,213,187  7/1980  Lawrence et al. ................. 364/724
4,236,224  11/1980  Chang ................................. 364/724

FOREIGN PATENT DOCUMENTS

1522698  8/1978  United Kingdom .
8001324  6/1980  World Int. Prop. O. .

OTHER PUBLICATIONS

H. J. Butterweck, "Suppression of Parasitic Oscillations in Second-Order Digital Filters by Means of a Controlled-Rounding Arithmetic", ARCHIV FUR ELEKTRONIK UND UBERTRAGUNGSTECHNIK (vol. 29, No. 9, pp. 371–374).

Bogner et al., *Introduction to Digital Filtering*, John Wiley & Sons, 1975, pp. 173–174, 364/745.

Primary Examiner—David H. Malzahn
Attorney, Agent, or Firm—Nixon & Vanderhye

[57] ABSTRACT

A 1st-order digital filter network has a quantizer (Q) reducing the number of output bits following multiplication (in M3). The quantizer omits insignificant bits, adding one LSB (boosting) or not (truncating) in dependence on the value of the multiplier output (D).

7 Claims, 3 Drawing Sheets

Practical processing scheme showing quantizer

Unity-gain leaky integrator network

Canonic unity-gain leaky integrator network

Practical processing scheme showing quantizer

Hypothetical equivalent network

Practical processing scheme showing quantizer

Hypothetical equivalent network

Practical processing
scheme showing quantizer

FIRST ORDER DIGITAL FILTER WITH CONTROLLED BOOST/TRUNCATE QUANTIZER

BACKGROUND OF THE INVENTION

The present invention concerns digital filters, and more especially quantization arrangements for 1st-order recursive filters.

The processors used to realize practical digital filters usually operate with fixed-point arithmetic of finite precision. Typically, the signs and magnitudes of signals are represented by 16-bit binary numbers, and the multipliers also have a finite coefficient range of, say, 16 bits. Under these circumstances, the resulting products are 31 bits long. This number field expansion could prove especially problematical in a recursive filter structure where the presence of a feedback loop containing a multiplier could result in the number length growing with each pass through the loop. To prevent number field overflow occuring the filter algorithm needs to incorporate a quantization routine.

A number of possible quantization strategies have been proposed; each introduce some signal distortion, but some have a less severe effect on the overall performance of the network than others.

Several quantization strategies have been researched in detail, but most of the reported work relates to 2nd-order networks, where the non-linear process gives rise to self-sustaining periodic distortions known as 'limit cycles'. See, for example:

(1) Jackson, L B: 'An analysis of roundoff noise in digital filters,' D.Sc disertation, Stevens Inst of Technology, Hoboken, NH, 1969.

(2) Sandberg, I W and Kaiser, J P: 'A bound on limit cycles in fixed-point implementation of digital filters,' IEEE Trans Audio and Electracoustics, Vol AU-20, June 1972, pp 110–112.

(3) Kieburtz, R B et al: 'Control of limit cycles in recursive digital filters by random quantisation,' IEEE Trans Circuits and Systems, Vol CAS-24, June 1977, pp 291–299.

(4) Lawrence, V B and Lee, A E: 'Quantisation schemes for recursive digital filters,' in IEEE Symposium on Circuits and Systems, Rome 1982.

(5) Parker, S R: 'Limit cycles and correlated noise in digital filters' in Digital Signal processing, ed J K Aggerwal, Western periodicals Company, 1979, pp 123–129. This is of limited relevance to 1st-order networks where the effect of quantization is usually observed as a constant off-set to the output signal, or a latch-up situation which masks signals below a certain level.

SUMMARY OF THE INVENTION

The present invention relates to a first-order digital filter comprising, in a first aspect, an input connected via subtraction means, multiplication means and addition means to an output; delay means for supplying the output signal to inputs of both the subtractor and the adder; and quantization means for reducing the number of bits in the output signal, the quantization means being arranged in operation to selectively either truncate or truncate and increment the output signal in dependence on the value of the signal at the output of the multiplier. Advantageously the quantizer is such that the output is incremented or not according to whether the multiplier output is respectively positive or negative.

The present invention also relates to a first-order digital filter in which, in a second aspect, there is quantization means for reducing the number of bits in the output signal following a multiplication stage arranged to be controlled in dependence on the value of the difference between the unquantized output sample and the value of the previous output sample.

DETAILED DESCRIPTION OF AN EXEMPLARY EMBODIMENT

The z-domain transfer function G(z) of a digital leaky integrator network is usually written as $$G(z) = 1/(1 - az^{-1}) \qquad (1)$$

where $0 < a < 1$, and a relates to the integration time constant.

If we make the substitution $$a = 1 - \alpha (0 < \alpha < 1) \qquad (2)$$

in equation 1, it can be seen that the dc gain of the network is $1/\alpha$. Thus the transfer function of a unity gain leaky integrator needs to include a scaling factor $\alpha$. This gives $$H(Z) = \alpha/(1 - (1-\alpha)Z^{-1}) \quad (a)$$
$$= \alpha/(1 - aZ^{-1}) \quad (b) \qquad (3)$$

Figure 1:
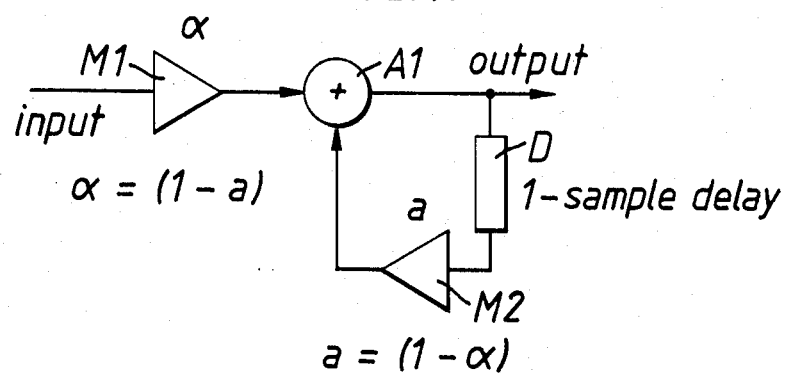
FIG. 1 shows a simple configuration of a first-order, digital, unit-gain leaky, integrator network.
Figure 2:
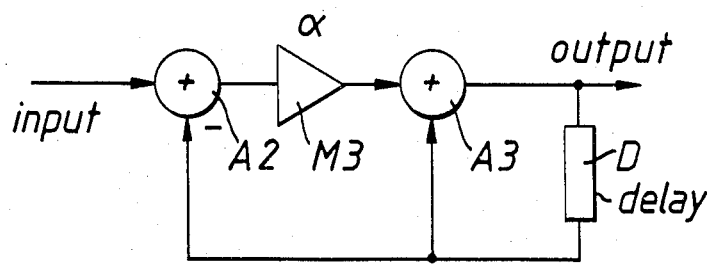
FIG. 2 shows the equivalent canonic configuration of the integrator network shown in FIG. 1.

This implies a processing scheme which utilizes two multipliers M1, M2 an adder A1 and a 1-sample delay D, as shown in FIG. 1. However the processing scheme adopted in FIG. 2 has the same transfer function, but requires only one multiplier M3. Thus, although it now uses two adders A2, A3 it is considered a more efficient processing configuration.

Figure 3:
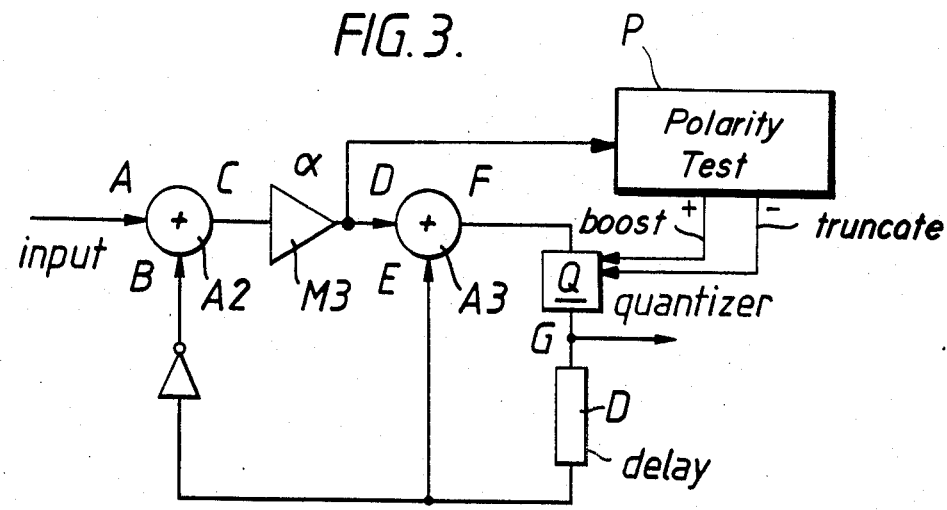
FIG. 3 shows a practical configuration of the integrator network shown in FIG. 2 including a quantizer in the output path.

FIG. 3 incorporates a quantizer Q, and is a practical processing scheme for realizing unity gain leaky integrators. It is the behavior of this realization, when using 2's complement arithmetic, that is to be discussed.

For the following analysis we will assume that the adders and multipliers, shown in FIG. 3, operate to full precision, and that the quantized signal has the same precision as the input signal. We will also assume that the negated signal at node B is obtained by inverting all the bits of the 2's complement number as it comes from the delay element. Thus, compared with a true 2's complement negation, the number at B will be in error by 1 least significant bit (lsb); 1 lsb is defined here as the weight of the step size of the quantizer. It will be shown that the effect of this error at the output of the network will be minimal. However, the errors introduced by some types of quantizers can have more significant comsequences.

In FIG. 3, the quantization error (e') is considered to be the difference between the full-precision number of node F and its quantized value at node G.

The error at node E is e, where e is e' delayed by 1 sample period. Similarly, the error at node B will be $(-e-1)$lsb. Thus, knowing the errors in the two feedback loops, it is possible to write down the total error (s) generated at node F. The units of s and e are in lsb's.

$$s = e + \alpha(-1-e) \qquad (4)$$

Figure 4:
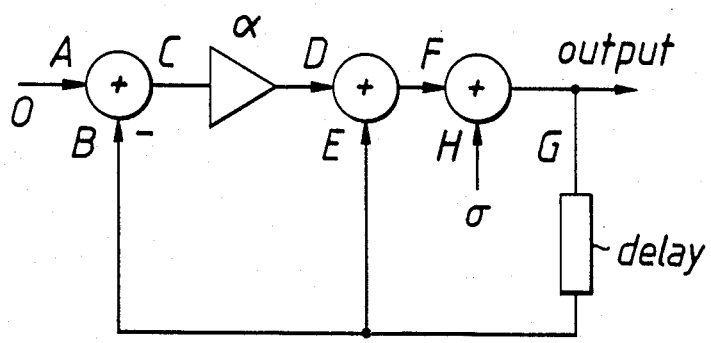
FIG. 4 shows an equivalent hypothetical configuration of the integrator network shown in FIG. 3.
Figure 3:
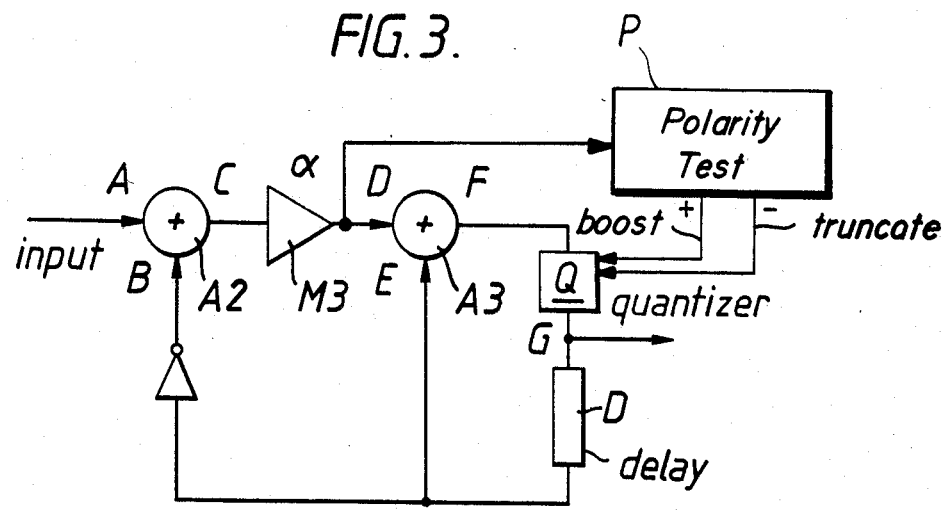
Figure 4:
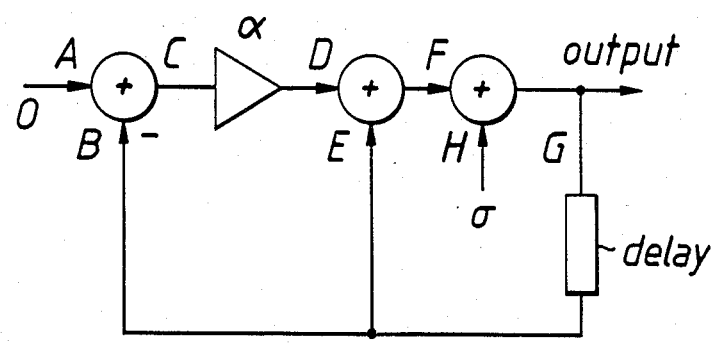

This is the error that is injected into the network each pass through the system. It is possible to analyze the behavior of the network by making reference to the hypothetical equivalent processing scheme shown in FIG. 4. Here, it is considered that all the component parts operate to infinite precision, and that this equivalent configuration has an additional input signal $\sigma$ at node H. It is not difficult to see that the transfer function between node H and the output is $$H(Z) = 1/(1-(1-\alpha)Z^{-1}) \qquad (5)$$

which has the same form as equation 1, and we have already seen that this has a dc gain of $1/\alpha$. Thus the error at the output will have a dc value r, where $$r = [\text{dc component of } \sigma]/\sigma \qquad (6)$$

These are the system equations which will be used to investigate the effects of the various quantization strategies.

It would of course be possible to quantize the signal by rounding, or by simple truncation. 2's complement rounding is equivalent to adding ½ lsb to the number and then truncating the result. Therefore, for a rounding quantizer the error (e) at node E will be between $(-\frac{1}{2}+d)$lsb and $+\frac{1}{2}$ lsb, where d is a positive fractional number. The asymmetry of the bound arises because a value that could be quantized with an error of $-\frac{1}{2}$ lsb would in fact be quantized to the next lower value, and be in error by $+\frac{1}{2}$ lsb. The value of d is equal to the smallest change that can occur in the full precision part of the network. It can therefore be shown that $d = \alpha$. Applying these bounds, it can be seen that when the input signal is changing, the dc component of e will be near zero. Therefore, under these conditions, the value of r will be negligible. However, in certain circumstances, particularly when the variance of the input signal is small or zero, successive samples of e become correlated, and this leads to e having a dc component in the range $-\frac{1}{2}+\alpha$ to $+\frac{1}{2}$ lsb's. Thus, using equations 4 and 6, it can be seen that an accumulated dc error in the range $(-1/(2\alpha) - \alpha + \frac{1}{2})$ and $(+1/(2\alpha) - 3/2)$ lsb's can occur, resulting in a latch-up condition whereby input signals between these levels have no effect on the output.

With 2's complement truncation on the other hand all the bits after the truncation point are ignored. This means that the error (e) at node E will be in the range $(-1+\alpha \leq e \leq 0)$lsb. As in the rounding case, the error at node B will be $(-1-e)$ lsb, which, for example, will range between $-\alpha$ and $-1$ lsb. Equations 4, 5 and 6 also apply to this truncating quantizer. Thus the analysis of the finite arithmetic effects can be performed using the same arguments as for the network containing the rounding quantizer. However, in this case, when large input signals are present e will have a mean dc component of approximately $-\frac{1}{2}$ lsb. Thus the output will always exhibit a dc error of around $-1/(2\alpha)$ lsb. The small input condition errors are even more severe, with latch-up occurring at values between $(-1/\alpha + 1 - \alpha)$ and $-1$ lsb's.

Alternatively, the dc component introduced by the truncation process could be offset by randomly boosting the quantized signal. The quantization algorithm for this type of quantizer is as follows: truncate the signal, then randomly add either 0 or 1 lsb to the truncated value The error (e) introduced by this process will be in the range $(-1+\alpha \leq e \leq 1)$ lsb. This means that the long-term dc component of e will be approximately zero. Therefore, from equation 4 it can be seen that the dc component of s will be around $-\alpha$. Thus, substituting in equation 6, we see that the mean accumulated error at the output of the network will be of the order of $-1$ lsb, and this is true whatever the nature of the input signal. Hence, a network using this scheme will not suffer from the high-level latch-up conditions exhibited by the previous two quantization strategies. The slight drawbacks to the method are that a suitable random control signal has to be generated, and the stochastic nature of the quantizer means that the short-term error on the output can be much higher than the mean error.

In the present invention, however, a Controlled Boosting and Truncating quantizer is employed. Detailed examination of the above quantization strategies shows that output signal latch-up does not always occur. For example, the outputs of a network containing a truncating quantizer will decay away to zero, under zero input conditions, if the starting values are positive numbers. Similarly, if the network contains a boosing quantizer the output will go to zero if the starting value is negative. Thus, choosing the appropriate quantization strategy on a polarity basis could lead to an improvement in output accuracy.

A simple choice of truncating positive numbers and boosting negative numbers would result in satisfactory operation for zero input conditions, but could result in off-set errors for high level signals, and low-level non-zero input signals being obscured. However, it has been found that these problems can be overcome if the polarity of the signal at node D is used to control the boost/truncate option. The control signal is easily derived at P; if the polarity is positive the quantizer should boost; if it is negative it should truncate. Thus, the quantizer is forced to take notice of the input signal, and this prevents the input signal being lost in the quantization noise.

A network which uses this controlled boost/truncate type of quantizer behaves in a much more orderly manner than the one that chooses randomly. Impulse responses and decay rates are predictable and do not exhibit localized gross errors that increase the low frequency content of the quantization noise.

Thus, of the four quantizers discussed, it would appear that the one adopting a controlled boosting or truncating quantization strategy would give the best performance. A quantizer of this sort is easy to implement, and results in a stable network which does not suffer from latch-up conditions or excessive quantization noise.

Figure 5:
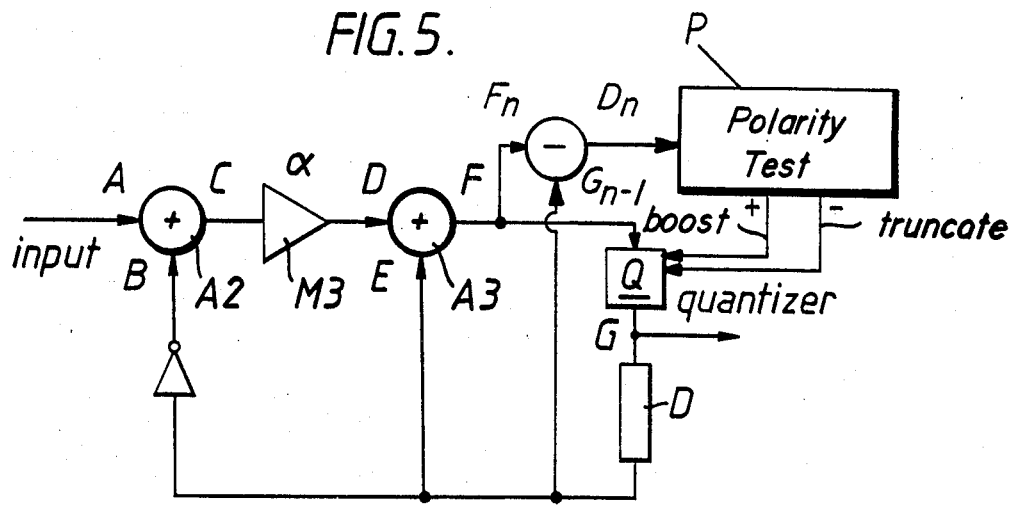
FIG. 5 shows an alternate configuration of the FIG. 3 embodiment.

Since, as shown in FIG. 3, the unquantized signal $F_n$ at node F is equal to the sum of the unquantized signal $D_n$ at node D and the just previous quantized output signal $G_{n-1}$ at node E, it follows from simple algebra that the quantization means could also be equivalently arranged to be controlled in dependence on the value of the difference between the unquantized signal $F_n$ and the value of the just previous quantized output sample $G_{n-1}$ (as depicted in FIG. 5).

I claim:

1. A first-order digital filter comprising:
   an input node connected via subtraction means, multiplication means, addition means and quantization means to an output node for accepting an input digital signal at said input node and providing an output digital signal at said output node which results from operation of said subtraction means, multiplication means, addition means and quantization means upon said input digital signal;
   said quantization means reducing the number of bits appearing at said output node relative to the number of bits resulting from operation of said subtraction means, multiplication means and addition means; and
   delay means for feeding back the output digital signal to both the subtraction means and the addition means;
   the quantization means being arranged in operation to selectively either (a) truncate or (b) truncate and increment the signal input thereto in dependence on the value of the output of the multiplication means.

2. A filter according to claim 1 in which the quantization means is such that the output is incremented or not according to whether the output of the multiplication means is respectively positive or negative.

3. A first-order digital filter including:
   a digital multiplication means connected via addition means to quantization means for accepting successive unquantized samples $F_n$ downstream from said multiplication means and for reducing the number of bits in said unquantized samples $F_n$ to produce a quantized output sample signal $G_n$,
   means for generating the difference between an unquantized sample $F_n$ and the value of the just-previous quantized output sample $G_{n-1}$; and
   wherein said quantization means produces said quantized output sample signal in dependence on the value of said difference.

4. A first-order digital filter comprising:
   digital processing means for accepting successive input digital signal samples of N bits each, (a) subtracting a supplied feedback digital signal therefrom to provide a resultant signal, (b) multiplying the resultant signal by another digital factor to produce a first intermediate result signal having more than N bits, and (c) adding said supplied feedback digital signal to the first intermediate result signal to produce a second intermediate result signal also having more than N bits;
   quantization means for accepting said second intermediate result signal and for providing an N bit output signal therefrom by selectively (a) truncating or (b) truncating and incrementing said second intermediate result signal under control of said first intermediate result signal; and
   delay means connected to receive said N-bit output signal and for subsequently supplying same as said supplied feedback digital signal to said digital processing means.

5. A first-order digital filter as in claim 4 wherein said quantization means (a) truncates when said first intermediate result signal has a negative polarity and (b) truncates and increments when said first intermediate result signal has a positive polarity.

6. A first-order digital filtering process comprising:
   (i) accepting successive input digital signal samples of N bits each, (a) subtracting a supplied feedback digital signal therefrom to provide a resultant signal, (b) multiplying the resultant signal by another digital factor to produce a first intermediate result signal having more than N bits, and (c) adding said supplied feedback digital signal to the first intermediate result signal to produce a second intermediate result signal also having more than N bits;
   (ii) accepting said second intermediate result signal and providing an N bit output signal therefrom by selectively (a) truncating or (b) truncating and incrementing said second intermediate result signal under control of said first intermediate result signal; and
   (iii) supplying said N bit output signal as said supplied feedback digital signal to said digital processing means during the next subsequent performance of step (i).

7. A first-order digital filtering process as in claim 6 wherein step (ii) uses (a) truncation when said first intermediate result signal has a negative polarity and (b) truncation and incrementation when said first intermediate result signal has a positive polarity.

* * * * *